United States Patent
Kern et al.

(10) Patent No.: US 7,102,873 B2
(45) Date of Patent: Sep. 5, 2006

(54) CAPACITOR ELEMENT AND METHOD FOR TRIMMING A CAPACITOR ELEMENT

(75) Inventors: Stefan Kern, Waghausel (DE); Marco Trautwein, Backnang (DE); Martin Schallner, Ludwigsburg (DE)

(73) Assignee: Marconi Communications GmbH, Backnang (DE)

( * ) Notice: Subject to any disclaimer, the term of this patent is extended or adjusted under 35 U.S.C. 154(b) by 0 days.

(21) Appl. No.: 10/499,858

(22) PCT Filed: Dec. 16, 2002

(86) PCT No.: PCT/IB02/05756

§ 371 (c)(1),
(2), (4) Date: Jan. 3, 2005

(87) PCT Pub. No.: WO03/054961

PCT Pub. Date: Jul. 3, 2003

(65) Prior Publication Data

US 2005/0105244 A1 May 19, 2005

(30) Foreign Application Priority Data

Dec. 21, 2001 (GB) .................................. 0130791.7

(51) Int. Cl.
*H01G 4/228* (2006.01)
(52) U.S. Cl. ................ 361/306.1; 361/306.3; 361/328; 361/330; 361/762; 361/763; 174/255; 174/256; 174/257

(58) Field of Classification Search ............. 361/306.3, 361/306.1, 328–330, 762–763, 793–794; 174/255–257
See application file for complete search history.

(56) References Cited

U.S. PATENT DOCUMENTS

| | | | | | |
|---|---|---|---|---|---|
| 4,868,613 | A | * | 9/1989 | Hirachi ....................... | 257/532 |
| 5,202,651 | A | * | 4/1993 | Yoshimasu .................. | 333/170 |
| 6,072,691 | A | * | 6/2000 | Suhara et al. ............... | 361/502 |
| 6,198,619 | B1 | | 3/2001 | Fujioka | |
| 6,225,756 | B1 | * | 5/2001 | Gitsevich .................... | 315/248 |
| 6,294,827 | B1 | * | 9/2001 | Iovdalsky et al. .......... | 257/678 |

FOREIGN PATENT DOCUMENTS

| | | |
|---|---|---|
| EP | 0 461 417 A2 | 12/1991 |
| JP | 10-12489 | 1/1998 |
| JP | 10-55933 | 2/1998 |

\* cited by examiner

*Primary Examiner*—Nguyen T. Ha
(74) *Attorney, Agent, or Firm*—Kirschstein, et al.

(57) ABSTRACT

A capacitor element on a chip, e.g., a MMIC chip, includes a main capacitor in parallel with a series configuration of trimming capacitors. The total capacitance value of the parallel arrangement can be increased from its inherently minimum value by applying one or more laser pulses to one or more of the trimming capacitors, such that in each case a short-circuit is produced between the metallization layer to which the pulses are applied and the other metallization layer making up the trimming capacitor.

5 Claims, 2 Drawing Sheets

CAPACITOR ELEMENT AND METHOD FOR TRIMMING A CAPACITOR ELEMENT

BACKGROUND OF THE INVENTION

The invention relates to a capacitor element in an integrated circuit device and a method for trimming a capacitor element in an integrated circuit device, the integrated-circuit device being in particular a monolithic microwave integrated circuit (MMIC) device.

DESCRIPTION OF THE RELATED ART

In MMIC device development it is usually the case that the first prototypes do not match the desired specifications and therefore the device (chip) need to be tuned to improve performance. Of particular interest is the trimming of capacitors, since these elements have a major influence on performance.

The conventional way of trimming capacitors on a chip is to connect a small capacitor to, or remove a small capacitor from, a large one by making a bond connection or removing an airbridge connection, respectively. This technique requires that sufficient space be provided on the chip to allow such bonding or removal to take place safely, without damaging any surrounding elements which may be necessary for the correct functioning of the circuit. This, however, acts against the current desire to reduce the space occupied by circuit elements to as small an area as possible, in order to enhance circuit performance generally (e.g. to raise the operating frequency). To illustrate, FIG. 1 shows a portion of an MMIC containing three trimming capacitor elements 10, 11, 12 on a common bottom plate, connected by 13. These are connected to surrounding circuitry (not shown) by means of airbridges, pads and tracks. In the case of capacitor element 10, this is connected to a bond-pad 18 via an airbridge 17, a further bond-pad 19 being provided connected to further circuitry (not shown) such that, if desired, a bond-wire may be connected between bond-pads 18 and 19 in order to bring trimming capacitor 10 into circuit. Capacitor 11 is connected to a large bond-pad 14 via an airbridge 15 and larger capacitor 12 to the same bond-pad 14 via a further airbridge 16.

As shown, sufficient space is allowed between the various components to enable test personnel to cut any of airbridges 15 and 16 in order to take their associated trimming capacitors out of circuit, or to make the bond connection 20 in order to bring the capacitor 10 into circuit, without damaging the surrounding circuit elements.

FIG. 2 shows the same arrangement, but this time with a considerably reduced spacing between the various components, in the interests of saving space on the chip and enhancing circuit performance. FIG. 3 is the same configuration as FIG. 2, but showing this time the bond-wire 20 connected and the airbridge 15 cut, in order to provide the desired trimming characteristics for the particular application in question. Here it can be clearly seen that considerable damage 22, 23, 24 has been caused to the airbridge 16, bondpad 14 and capacitor element 11, respectively, due to the bonding/cutting actions on the bond-pads 18, 19 and airbridge 15, respectively. This is all due to the reduction of space allowed on the chip.

In accordance with first, second and third aspects of the invention there are provided a trimming-capacitor element as recited in claim 1, a capacitor element as specified in claim 2 and a method for trimming a capacitor element in a microwave integrated-circuit device as set forth in claim 4.

BRIEF DESCRIPTION OF THE DRAWINGS

Embodiments of the invention will now be described, by way of non-limiting examples only, with the aid of the accompanying drawings, of which.

DETAILED DESCRIPTION OF THE PREFERRED EMBODIMENTS

Figure 1:
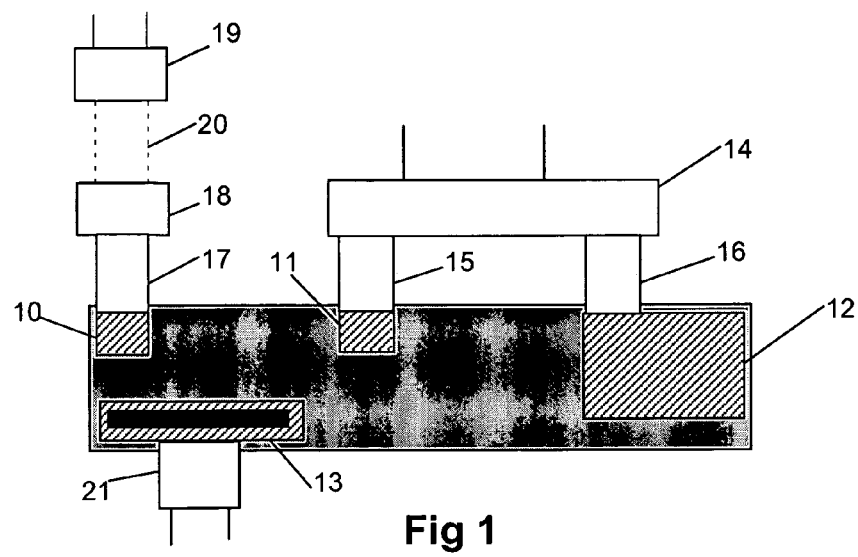
FIG. 1 is a plan view of a portion of a chip comprising a typical known trimming capacitor arrangement.
Figure 2:
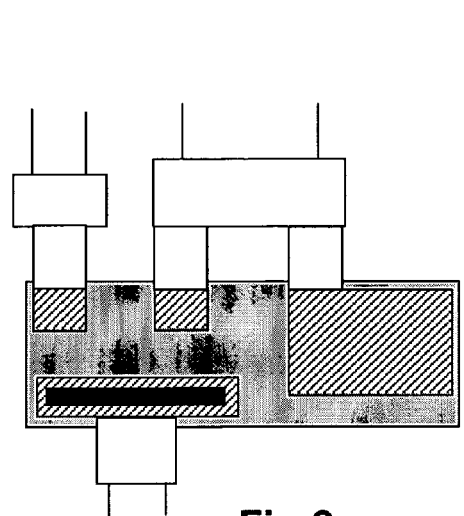
FIG. 2 is the same arrangement as FIG. 1, but with reduced spacing between the components.
Figure 3:
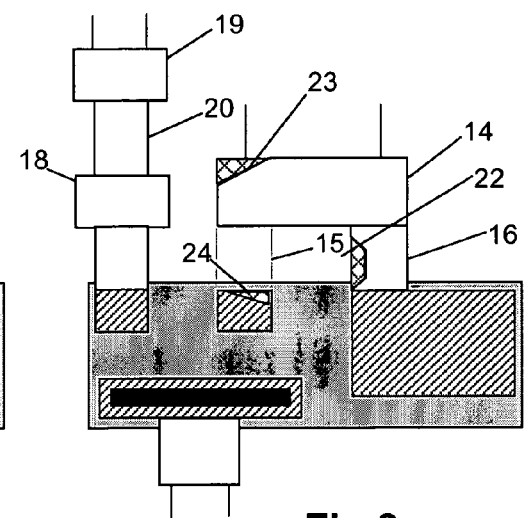
FIG. 3 shows the same arrangement as FIG. 2, but with one trimming capacitor brought into circuit and another taken out of circuit.
Figure 4:
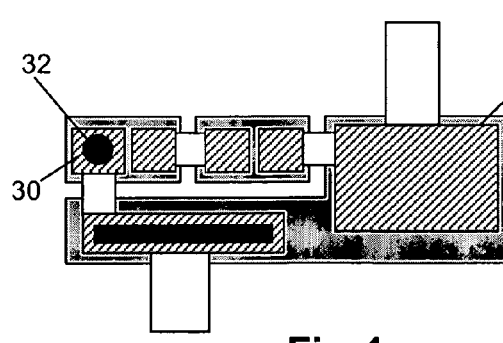
FIGS. 4 and 6 are plan views of a portion of a chip showing a trimming capacitor arrangement in accordance with the invention.
Figure 5:
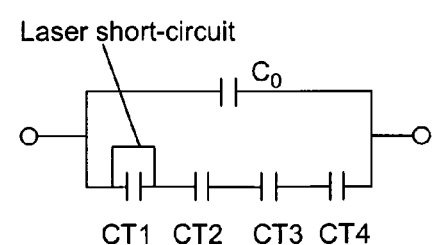
FIGS. 5 and 7 are circuit diagrams of a capacitor element with trimming facility in accordance with an embodiment of the invention.
Figure 6:
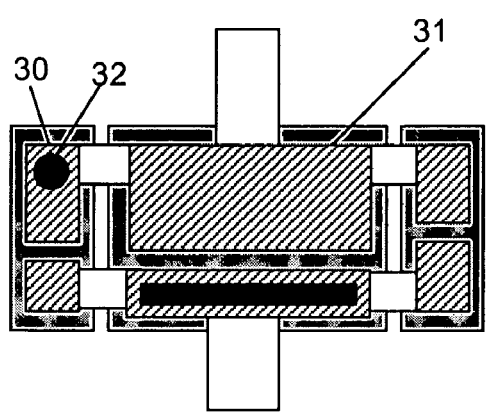

Referring now to FIG. 4 or 6, respectively, similar trimming-capacitor elements to those shown in the FIG. 2 and FIG. 3 arrangements are illustrated, at the same reduced component spacings, but this time the various trimming capacitors are not brought into or removed from circuit by bonding and cutting operations, respectively, but by a laser short-circuiting process. This is made clearer with reference to FIGS. 5 and 7, respectively, in which a main capacitor $C_0$ is shown connected in parallel with four trimming capacitors $C_{T1}$, $C_{T2}$, $C_{T3}$ and $C_{T4}$ configured in series. The trimming capacitors may each take the form of a MIM (metal-insulator-metal) capacitor and may have equal or unequal values of capacitance. With all four trimming capacitors in circuit, the total capacitance of the arrangement is at a minimum, since all four trimming capacitors are connected in series. Assuming now that the total capacitance is required to be raised from its minimum level, one of the four trimming capacitors (e.g. $C_{T1}$ as shown) is subjected to a laser-pulsing operation, whereby, by the application of one or more laser pulses to one of the metallizations making up the capacitor, the metal can be melted and, by virtue of the energy inherent in the laser pulse, made to penetrate the dielectric layer separating the two metallization layers, the thus distorted melted metal then coming into contact with the other metallization layer, thereby forming a short-circuit. As already mentioned, more than one laser pulse may be necessary to ensure a reliable short-circuit. The additional laser shots, as required, may be applied at the border of the first, main, shot.

Should the removal of the trimming capacitor $C_{T1}$ be inadequate for the purpose, one or more further such capacitors (e.g. $C_{T3}$) may be similarly short-circuited, thereby raising the total capacitance value further. Clearly, when all the trimming-capacitors have been short-circuited, the overall capacitance is at its maximum and no more trimming is possible.

Figure 7:
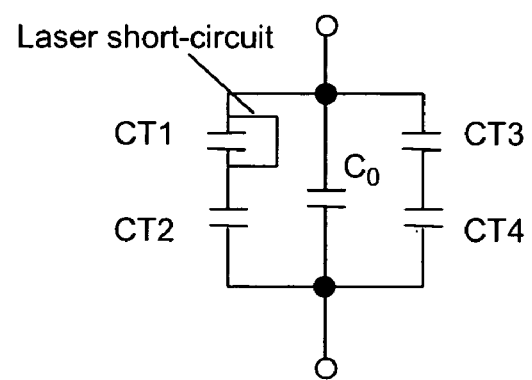

The circuits of FIGS. 4 and 6, respectively, are arranged to correspond to the circuit topology of FIGS. 5 and 7, respectively. Thus in Figure the 4 four trimming capacitor elements are connected in series with each other by suitable connection means and the total series arrangement is connected in turn to a main capacitor element. In FIG. 6 the four trimming capacitors are connected in parallel with the main capacitor in the form of two serially connected pairs. These figures shows one of the four trimming-capacitor elements 30 as being short-circuited by the described laser-pulse method at sites 32. Alternatively Element 31 could be short-circuited in two distinct places in view of its considerable size.

Thus it can be seen that, by the use of the laser-pulse trimming process described above, a trimming-capacitor arrangement can be provided which saves considerably on the space which is normally needed in the conventional trimming configurations in order to prevent damage to the surrounding components. This is because no cutting or bonding is needed to provide the trimming action, this being achieved instead by the application of laser pulses to one or more of the trimming-capacitor elements, such pulses producing a short-circuit which replaces the capacitance in question with a low-resistance-value ohmic connection.

The invention claimed is:

1. A trimming-capacitor element in an integrated-circuit device, comprising:
   a) first and second metallic plate-portions;
   b) a dielectric-portion disposed between the metallic plate-portions; and
   c) a short-circuit formed by a laser-pulse process, whereby metal from the first metallic plate-portion is in electrical contact with metal from the second metallic plate-portion.

2. The element as claimed in claim 1, wherein the integrated-circuit device is a monolithic microwave integrated-circuit device (MMIC).

3. A capacitor element in an integrated-circuit device, comprising:
   a) a main capacitor in a first branch; and
   b) a trimming-capacitor arrangement in a second branch parallel to the first branch, the trimming-capacitor arrangement including a plurality of trimming capacitors configured in series, each trimming capacitor having first and second metallic plate-portions, a dielectric-portion disposed between the metallic plate-portions, and at least one of the trimming capacitors being short-circuited by a laser-pulse process, whereby metal from the first metallic plate-portion is in electrical contact with metal from the second metallic plate-portion.

4. The element as claimed in claim 3, wherein the integrated-circuit device is a monolithic microwave integrated-circuit device (MMIC).

5. A method of trimming a capacitor element in a microwave integrated-circuit device, comprising the steps of:
   a) connecting a trimming-capacitor arrangement in parallel with the capacitor element, the trimming-capacitor arrangement including a plurality of trimming capacitors configured in series, each trimming capacitance having first and second metallic plate-portions and a dielectric-portion disposed therebetween; and
   b) increasing a total capacitance value of the trimming-capacitor arrangement by applying at least one pulse of laser energy to at least one of the series trimming capacitors, such that metal from the first metallic plate-portion comes into electrical contact with metal from the second metallic plate-portion.

* * * * *